United States Patent [19]

Ida

[11] 4,308,504
[45] Dec. 29, 1981

[54] DIRECT-COUPLED AMPLIFIER CIRCUIT WITH DC OUTPUT OFFSET REGULATION

[75] Inventor: Masaru Ida, Hamamatsu, Japan

[73] Assignee: Nippon Gakki Seizo Kabushiki Kaisha, Hamamatsu, Japan

[21] Appl. No.: 100,052

[22] Filed: Dec. 4, 1979

[30] Foreign Application Priority Data

Dec. 28, 1978 [JP] Japan .................. 53-164841

[51] Int. Cl.³ .......................................... H03F 3/45
[52] U.S. Cl. ............................... 330/253; 330/259
[58] Field of Search ............ 330/253, 255, 256, 258, 330/259, 260, 261, 300

[56] References Cited

U.S. PATENT DOCUMENTS

| | | | |
|---|---|---|---|
| 3,370,242 | 2/1968 | Offner | 330/253 X |
| 3,434,069 | 3/1969 | Jones | 330/259 |
| 3,868,583 | 2/1975 | Krabbe | 330/259 |
| 3,955,149 | 5/1976 | Trilling | 330/258 |

Primary Examiner—James B. Mullins
Attorney, Agent, or Firm—Frishauf, Holtz, Goodman and Woodward

[57] ABSTRACT

A direct-coupled amplifier circuit includes an input stage differential amplifier comprised of a differential pair of field effect transistors and a pair of bipolar transistors connected in series with the differential field effect transistors, respectively and having their emitters coupled together. Gate electrodes of the differential field effect transistors are coupled to an input terminal and an output terminal of the amplifier circuit, respectively. The collector-to-emitter voltages of the bipolar transistors are controlled in accordance with the magnitude and polarity of an output DC offset voltage appearing on the output terminal so as to reduce the DC offset voltage.

6 Claims, 2 Drawing Figures

4,308,504

DIRECT-COUPLED AMPLIFIER CIRCUIT WITH DC OUTPUT OFFSET REGULATION

BACKGROUND OF THE INVENTION

This invention relates to an all-stage direct-coupled amplifier, and more specifically to an all-stage direct-coupled amplifier capable of output offset regulation.

Prior art direct-coupled amplifiers employ various measures to reduce a DC output offset voltage. The simplest approach to this problem is to provide a capacitor between a feedback input terminal of a first stage differential amplifier circuit and circuit ground. Such approach will, however, adversely affect on the low-frequency response of the amplifier. Maintenance of satisfactory low-frequency response requires the use of a large-capacitance capacitor, which would cause unstable circuit operation.

An output offset regulator circuit utilizing thermal coupling between semiconductor devices, as shown in FIG. 1, has recently been used in an all-stage direct-coupled amplifier. In the all-stage direct-coupled amplifier of FIG. 1, a first stage differential amplifier is comprised of field effect transistors 1 and 2 in order to give a high input impedance characteristic to a power amplifier. The output signal of the first-stage differential amplifier is amplified by a second-stage amplifier 3 including driver and output power stages, and led to an output terminal 4 connected to a load (not shown) such as a loudspeaker. The output terminal 4 is direct-coupled to a feedback input terminal of the first stage differential amplifier, i.e., the gate of the field effect transistor 2. A load of the differential amplifier is a current mirror circuit comprised of bipolar transistors 5 and 6. The transistors 5 and 6 thermally coupled with transistors 7 and 8 respectively. The bases of transistors 7 and 8 are connected to outputs of a comparator or differential amplifier 9 with one input coupled to the output terminal 4 and the other input coupled to circuit ground, whereby collector currents or junction temperatures of the transistors 7 and 8 are controlled in dependence on the magnitude and polarity of an offset error voltage appearing at the output terminal 4. Thus, the collector currents of transistors 5 and 6 thermal-coupled with the transistors 7 and 8 are controlled to reduce the offset error voltage. This circuit is effective in minimizing the offset voltage since the offset voltage may be regarded as an input-referred offset voltage of the comparator 9.

In the above-mentioned circuit, however, if the collector currents of the transistors 5 and 6 are changed, then the drain currents of FET's 1 and 2 will change to shift their operating points. This will lead to a change in the mutual conductance gm of the FET's and occurrence of distortion.

SUMMARY OF THE INVENTION

It is therefore an object of this invention to provide a direct-coupled amplifier capable of output offset regulation with reduced influence on the circuit characteristic.

A direct-coupled amplifier circuit in accordance with this invention comprises an input stage differential amplifier comprised of a differential pair of transistors having their control electrodes coupled to an input terminal to receive an input signal and an output terminal to be coupled to a load, respectively, and a pair of transistors having their conduction paths connected in series with conduction paths of the differential transistors, respectively and their corresponding electrodes of one pair coupled together. The voltages across the conduction paths of the second-mentioned pair of transistors are controlled in accordance with the magnitude and polarity of a DC offset voltage appearing on the output terminal so as to reduce the DC offset voltage.

DESCRIPTION OF THE PREFERRED EMBODIMENT

Figure 1:
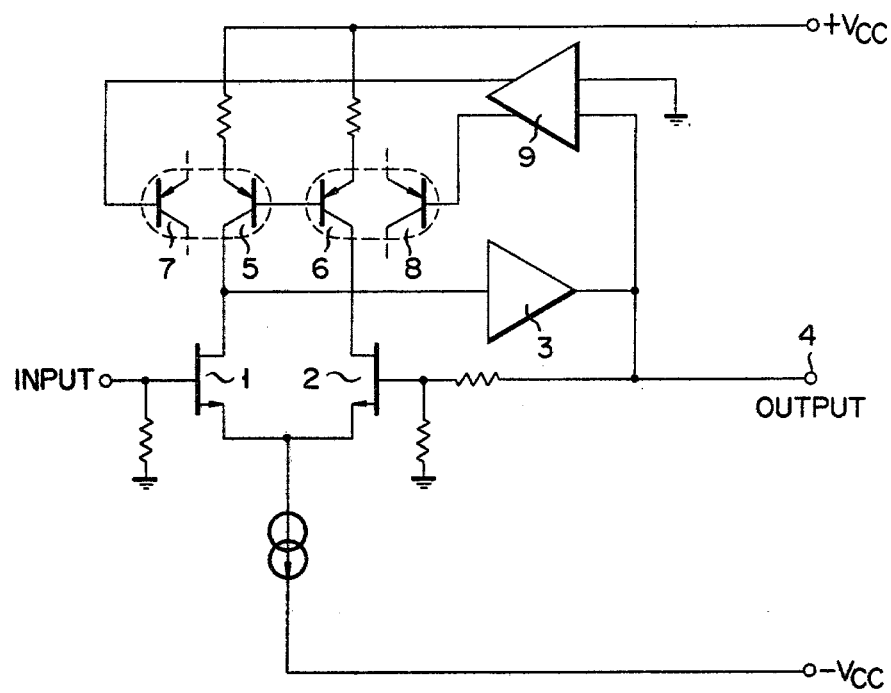
FIG. 1 is a schematic circuit diagram of a prior art direct-coupled amplifier with output offset regulation.
Figure 2:
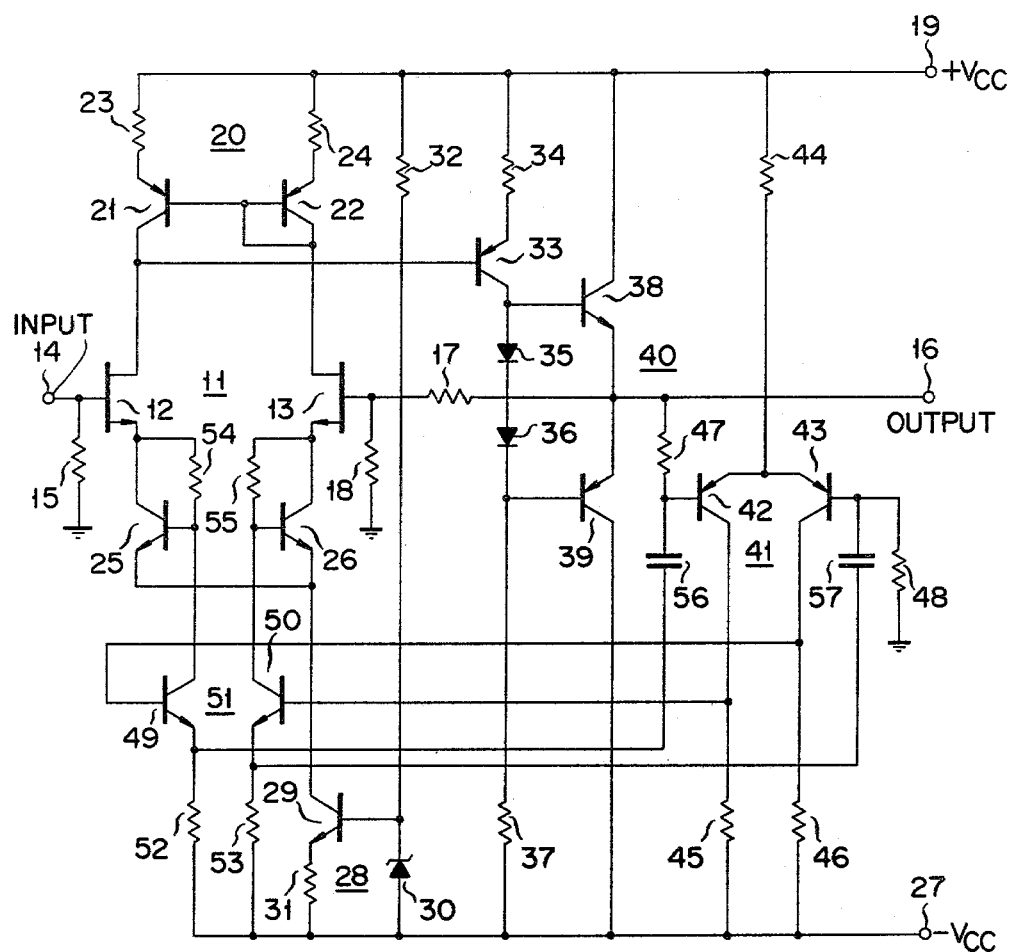
FIG. 2 is a schematic circuit diagram of a direct-coupled amplifier embodying this invention.

In a direct-coupled power amplifier circuit embodying this invention and shown in FIG. 2, an input stage differential amplifier 11 is comprised of a differential pair of field effect transistors (FET's) 12 and 13. The FET 12 has its gate electrode connected to an input terminal 14 and to circuit ground through a resistor 15, while the FET 13 has its gate electrode connected through a negative feedback resistor 17 to an output terminal 16 to be connected to a load such as a loudspeaker and to circuit ground through a resistor 18. The FET's 12 and 13 have their drain electrodes connected to a positive power supply terminal 19 (+VCC) through a current mirror load 20 comprised of bipolar transistors 21 and 22 and resistors 23 and 24. The FET's 12 and 13 have their source electrodes respectively connected to collectors of bipolar transistors 25 and 26 whose emitters are connected together to a negative power supply terminal 27 through a constant current source 28 comprised of a bipolar transistor 29, zener diode 30 and resistors 31 and 32 as shown. The collector-to-emitter voltages of the transistors 25 and 26 are controlled as described below to correct the output offset at the output terminal 16.

The drain electrode of FET 12 is connected to the base of a driver transistor 33 having its emitter connected to the positive power supply terminal 19 through a resistor 34 and its collector connected to the negative power supply terminal 27 through series-connected diodes 35 and 36 and a resistor 37. Complementary power transistors 38 and 39 forming a single-ended push-pull output circuit 40 have their collectors connected to the positive and negative power supply terminals 19 and 27, respectively, their emitters connected together to the output terminal 16 and their bases connected across the series-connected diodes 35 and 36 so that a constant biasing current flows through each of the power transistors 38 and 39 for class B operation.

To the output terminal 16 is connected a differential amplifier 41 for detecting an offset voltage which comprises a differential pair of transistors 42 and 43 having their emitters connected together to the positive power supply terminal 19 through a resistor 44 which may be replaced by a constant current source and their collectors connected to the negative power supply terminal 27 through resistors 45 and 46, respectively. The base of transistor 42 is connected to the output terminal 16 through a resistor 47, while the base of transistor 43 is connected to circuit ground through a resistor 48.

The collectors of transistors 43 and 42 are connected to the bases of transistors 49 and 50, respectively, which form an offset regulation circuit 51 and have their emitters connected to the negative power supply terminal 27 through resistors 52 and 53, respectively. The collectors of transistors 49 and 50 are connected to the bases of transistors 25 and 26, respectively, and to the collectors of transistors 25 and 26 through resistors 54 and 55, respectively. A capacitor 56 is connected from the base of transistor 42 to the emitter of transistor 49 and a capacitor 57 is connected from the base of transistor 43 to the emitter of transistor 50. Due to the connection of the capacitors 56 and 57 from the differential amplifier 41 to the transistors 49 and 50, the offset regulation circuit 51 is made responsive only to a DC output offset voltage appearing at the output terminal 16. That is, proper selection of the capacitance values of capacitors 56 and 57 may change the base potential and emitter potential of each of the transistors 49 and 50 by substantially the same amount with respect to AC signals on the output terminal 16.

With the circuit of FIG. 2 an AC input signal applied to the input terminal 14 is amplified in turn by the input stage differential amplifier 11, driver transistor 33 and power transistors 38 and 39 and then delivered to the load through the output terminal 16 in a known manner.

There will now be described the output offset regulation in the circuit of FIG. 2. When a DC output offset voltage is zero the apparent gate-to-source voltage of FET12 or the voltage Va between the gate of FET12 and the emitter of transistor 25 and the apparent gate-to-source voltage of FET13 or the voltage Vb between the gate of FET13 and the emitter of transistor 26 are equal to each other. When a positive offset voltage appears at the output terminal 16 due to temperature change the collector current of the transistor 42 decreases whereas the collector current of the transistor 43 increases. As a result, the collector current of transistor 49 increases whereas the collector current of transistor 50 decreases. This gives rise to an increase in the collector-to-emitter voltage V1 of transistor 25 or the apparent gate-to-source voltage Va of FET12 and a decrease in the collector-to-emitter voltage V2 of transistor 26 or the apparent gate-to-source voltage Vb of FET13 so that Va and Vb become equal to each other, that is, the offset voltage is reduced to zero.

When a negative offset voltage is produced on the output terminal 16, on the other hand, the collector current of transistor 42 increases whereas the collector current of transistor 43 decreases. As a result, the collector current of transistor 50 increases whereas the collector current of transistor 49 decreases. Contrary to the foregoing, therefore, the collector-to-emitter voltage V1 of transistor 25 decreases whereas the collector-to-emitter voltage V2 of transistor increases so that the apparent gate-to-source voltage Va of FET12 and the apparent gate-to-source voltage Vb become equal to each other to regulate the output offset.

Although this invention may be applied to a direct-coupled power amplifier whose input stage differential amplifier is comprised of a differential pair of bipolar transistors, it is particularly suitable for a direct-coupled amplifier whose input stage differential amplifier is formed of FET's having a gain lower than bipolar transistors. Although, in the circuit of FIG. 2, the differential amplifier 41, that is, offset detection circuit is connected to the output terminal 16 to directly detect the magnitude and polarity of a DC offset voltage, the offset detection circuit may be arranged to detect the magnitude and polarity of the DC offset voltage in accordance with changes in ambient temperature.

What is claimed is:
1. A direct-coupled amplifier circuit having an input terminal to receive an input signal and an output terminal to be coupled to a load, comprising:
an input stage differential amplifier including a differential pair of first and second transistors each having a control electrode and first and second electrodes defining a conduction path therebetween, said control electrode of said first transistor being coupled to said input terminal and said control electrode of said second transistor being coupled to said output terminal through a negative feedback network, and third and fourth transistors having their control electrodes, first and second electrodes defining conduction paths therebetween connected in series with said conduction paths of said first and second transistors, respectively, the second electrodes of said third and fourth transistors being coupled together to a constant current source for maintaining the currents flowing in said conduction paths of said first and second transistors constant;
an offset detection circuit for detecting the magnitude and polarity of an output DC offset appearing on said output terminal; and
a DC offset regulation circuit for controlling only said output DC offset, said offset regulation circuit being coupled to said offset detection circuit and to the control electrodes of said third and fourth transistors for controlling voltages across said conduction paths of said third and fourth transistors as a function of the magnitude and polarity of said output DC offset detected by said offset detection circuit to thereby control said output DC offset.

2. The direct-coupled amplifier circuit according to claim 1 wherein said first and second transistors are field effect transistors, and said third and fourth transistors are bipolar transistors, respectively.

3. The direct-coupled amplifier circuit according to claim 1 wherein said offset detection circuit includes a differential pair of bipolar transistors having their bases coupled to said output terminal and circuit ground, respectively.

4. The direct-coupled amplifier circuit according to claim 1 wherein said offset detection circuit includes a differential pair of fifth and sixth bipolar transistors having their bases coupled to said output terminal and circuit ground, respectively, and said offset regulation circuit includes seventh and eighth bipolar transistors having their bases coupled to collectors of said sixth and fifth bipolar transistors, respectively, and their collectors coupled to said control electrodes of said third and fourth transistors, respectively.

5. The direct-coupled amplifier circuit according to claim 1 wherein said offset detection circuit comprises capacitor means coupled between an input of an output of said offset detection circuit.

6. A direct-coupled amplifier circuit having an input terminal to receive an input signal and an output terminal to be coupled to a load, comprising:
a differential amplifier including a differential pair of first and second field effect transistors each having a gate electrode, drain electrode and source electrode defining a conduction path therebetween, said gate electrode of said first field effect transistor being coupled to said input terminal and said gate electrode of said second field effect transistor being coupled to said output terminal through a negative feedback network, and third and fourth bipolar transistors having their collector-emitter paths connected in series with said conduction paths of said first and second transistors, respectively, and their emitters coupled together to a constant current source for maintaining the currents flowing in said conduction paths of said first and second field effect transistors constant; and circuit means coupled to said output terminal and to the bases of said third and fourth bipolar transistors for controlling collector-to-emitter voltages of said third and fourth bipolar transistors as a function of the magnitude and polarity of an output DC offset on said output terminal, to thereby control only said output DC offset.

* * * * *